United States Patent [19]

Roddy

[11] 4,097,706

[45] Jun. 27, 1978

[54] MOLDED ENCLOSURE HAVING ZERO DRAFT OPENINGS FORMED IN IT

[75] Inventor: Joseph T. Roddy, Ballwin, Mo.

[73] Assignee: Emerson Electric Co., St. Louis, Mo.

[21] Appl. No.: 782,922

[22] Filed: Mar. 30, 1977

[51] Int. Cl.² ............................................. H01H 9/02
[52] U.S. Cl. ................................. 200/293; 200/303; 220/3.2
[58] Field of Search ................... 174/50, 50.53, 50.54, 174/52 R; 200/293, 296, 297, 303; 220/3.2, 3.8

[56] References Cited

U.S. PATENT DOCUMENTS

| | | | |
|---|---|---|---|
| 3,313,905 | 4/1967 | Zagorski | 200/303 |
| 3,803,342 | 4/1974 | Stearley et al. | 200/303 X |
| 3,883,705 | 5/1975 | Sebastian et al. | 200/303 X |
| 3,944,773 | 3/1976 | Schumacher | 200/293 |
| 3,966,074 | 6/1976 | Hotchkiss et al. | 220/3.8 |

*Primary Examiner*—Stephen Marcus
*Attorney, Agent, or Firm*—Polster, Polster and Lucchesi

[57] ABSTRACT

A molded part, which in the preferred embodiment, comprises a plastic switch enclosure, has openings formed in it for receiving terminal elements of the switch. The openings are defined by side walls along the material thickness of the enclosure. The side walls are constructed so that they are a portion of a conic section. Each conic section has at least one line segment parallel to a line segment of the conic section delimiting the oppositely opposed side wall of the openings. The line segments are located at and define the smallest width size of the opening, all other portions of the walls defining an opening size of greater width. Consequently, the conic section and line segment pair effectively provide a no-draft, close tolerance opening through the enclosure.

11 Claims, 5 Drawing Figures

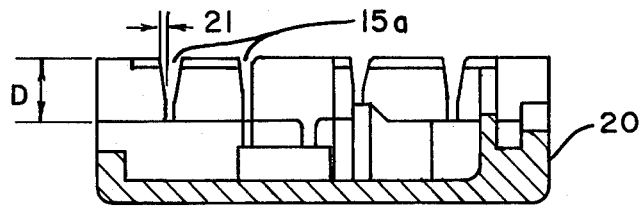
FIG. 1. (PRIOR ART)
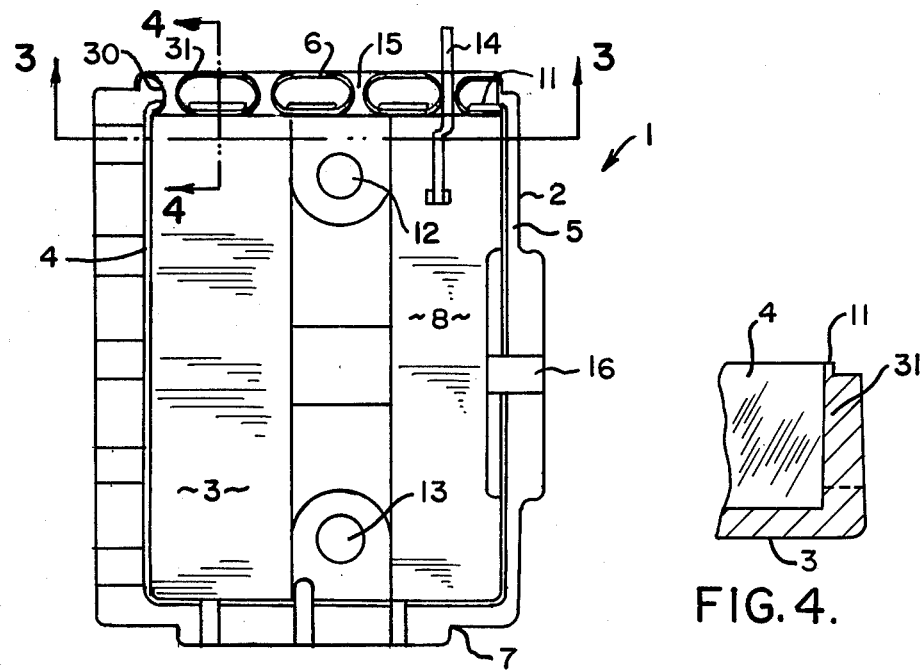
FIG. 2.
FIG. 4.
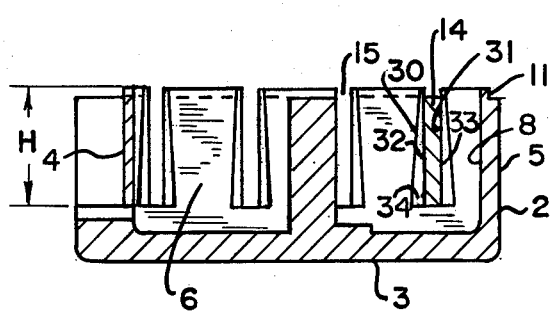
FIG. 3.
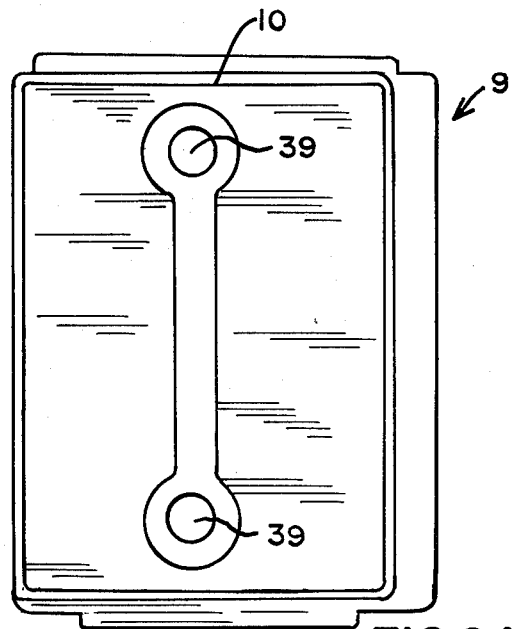
FIG. 2A.

MOLDED ENCLOSURE HAVING ZERO DRAFT OPENINGS FORMED IN IT

BACKGROUND OF THE INVENTION

This invention relates to molded parts and in particular, to a molded plastic enclosure having at least one opening in it, the opening having zero effective draft. While the invention is described with particular reference to its application with dynamoelectric machine switch structures, those skilled in the art will recognize the wider applicability of the inventive principles disclosed hereinafter.

In many motor applications, an electrical switch assembly is provided in conjunction with the motor to facilitate use of the motor in the particular application. For example, in certain domestic appliances, the motor is supplied with a switch structure which is operatively connected to a centrifugal actuator. The interaction of the actuator and the switch structure enables the combination to connect and disconnect various ones of the motor winding to a source of electrical energy as the motor progresses from a starting condition to a run condition. In addition, the switch structure also may be used to interconnect various other functional aspects of the appliance to the electrical energy source.

Switch structures of the type in which the present invention finds application often are used in adverse environments, so that the switch enclosure, including that portion where the terminals protrude, must be sealed in some manner from the surrounding environment. Each terminal also must be tight fitting with the enclosure, in order to prevent movement of the terminal and subsequent misalignment of the switch contacts within the enclosure.

In the past, switch enclosures for motor applications have been symmetrical parts, each of the parts comprising approximately half of the enclosure. The parts have complementary openings formed in them, which receive the terminals of the switch assembly. When the parts are joined to one another the openings form slots through the enclosure. The terminals extend through the enclosure along the slots, and are held in position by designing the outermost part of the slots for that purpose, outermost being referenced to the depth dimension of the enclosure. Such an arrangement requires relatively complicated molds for the switch enclosure structure, complicates the assembly of the switch and generally adds cost to the motor.

The invention disclosed hereinafter overcomes these prior art deficiencies by providing a deep draft enclosure construction. That is to say, the enclosure portion having the terminals passing through it has a depth sufficient to enable it to house the entire terminal. The open side of the enclosure may be closed by a simple cover plate. Such an arrangement simplifies mold construction and final switch assembly. The openings through the enclosure are defined by a pair of walls constructed so that a surface line along each of the oppositely opposed surfaces of the walls are parallel to one another. That surface line abuts the terminal along the entire terminal height. Consequently, the chamber within the enclosure may be made impervious to switch environment.

One of the objects of this invention is to provide an improved switch enclosure.

Another object of this invention is to provide an enclosure having at least one opening in it permitting the passage of a second device, the opening being defined by at least two walls, at least one surface line along each of the walls being parallel to one another for the entire length of the wall.

Other objects of this invention will be apparent to those skilled in the art in light of the following description and accompanying drawings.

SUMMARY OF THE INVENTION

In accordance with this invention, generally stated, a molded enclosure having at least one opening in it is provided which permits formation of the opening with zero effective draft along that portion of the enclosure defining the opening. Preferably, the enclosure is a switch body for a switch assembly. The opening is defined by a pair of oppositely opposed side walls. The side walls are partial, conic sections, the surface areas of which each have one line segment at the point of minimum separation between the side walls. The line segments are parallel to one another, and define a zero draft line for the opening.

BRIEF DESCRIPTION OF THE DRAWINGS

In the drawings,

FIG. 1 is a view in section of an illustrative example of a prior art switch body;

FIG. 2 is a top plan view of one illustrative embodiment of enclosure of this invention;

FIG. 2a is a top plan view of top wall compatible with the enclosure of FIG. 2;

FIG. 3 is a sectional view taken along the line 3—3 of FIG. 2; and

FIG. 4 is a sectional view taken along the line 4—4 of FIG. 2.

DESCRIPTION OF THE PREFERRED EMBODIMENT

Referring now to the drawings, reference numeral 1 indicates one illustrative embodiment of enclosure of this invention, shown in FIGS. 2 through 4 as a switch body 2.

Switch body 2 generally is rectangular in plan, having a bottom 3, a first pair of oppositely opposed side walls 4 and 5, and a second pair of oppositely opposed sides 6 and 7. The bottom and side walls delimit a cavity 8 which receives suitable switch structure, not shown, for use with the enclosure 1. As indicated above, the switch body 2 preferably is impervious to environmental contamination. The cavity 8 is closed by a top 9, shown in FIG. 2a, which may be a simply designed side wall having a lip 10 extending outwardly from it. The lip 10 mates with a complimentary lip 11 formed along the upper end of the opposed side walls, upper being referenced to the drawings of the body section 2. The lips 10 and 11 are sized so that they intermount in a friction fit. Additional sealing material in the way of an adhesive substance, for example, may be used to seal the joint between the lips 10 and 11, if desired.

The body section 2 has a pair of openings 12 and 13 formed in it, which are sized to receive conventional threaded fasteners. Top 9 also has a pair of openings 39 through it which are positioned to align with the openings 12 and 13 of the body section 2 in the intermounted position of the top and body section. While important in the use of the switch, the opening design and location are a matter of design choice. A variety of other design features may be incorporated into the body section 2 or top 9 construction which are important in the operation of the switch assembly, but which form no part of this invention. Consequently, these features are not described in detail.

Switch operation, however, requires that a plurality of terminals 14 extend through a corresponding number of openings 15 in the sides 6 and 7 of the switch body 2. Commonly, a switch arm, not shown, operatively connected to a suitable centrifugal actuator of a dynamoelectrical machine, for example, passes through an opening 16 in the side 5. The switch arm engages various ones of the terminals 14 during switch operation. The various openings 15 and 16 may be constructed in accordance with the principles of this invention, later described in greater detail. As illustrated in the drawings, only the openings 15 in the side 6 are so constructed.

A major distinction between my invention and enclosures found in the prior art is easily observed by comparing FIGS. 1 and 3. In FIG. 1, a switch body portion 20 generally has an overall design silhouette similar to that shown in FIG. 2. However, the depth D of the terminal receiving openings 15a in the body portion 2 is about one half of the height of the total terminal height. The other half of the prior art enclosure is formed from a second portion of the switch assembly, not shown, which is complementary to the enclosure portion illustrated in FIG. 1. Because each prior art enclosure is formed from complementary portions, rather complex molds are required for switch enclosure manufacture. As will be appreciated by those skilled in the art, molding techniques used in the construction of the enclosure components require that a predetermined draft or taper 21 be included in the component design, in order to remove it from the appropriate mold without damage. Normally, the use of the draft 21 with a molded part is acceptable. When the part is used in a switch enclosure, however, the draft 21 complicates the job of sealing the cavity of the enclosure from environmental conditions. To overcome this problem, the prior art has developed the complementary enclosure halves discussed above.

In distinction to these prior art designs, the switch body 2, because of its unique construction, may have a depth H for the opening 15 substantially equal to the total height of the terminals 14. This in turn permits the cover 9 to be of a relatively simple design, since the cover 9 is not used to receive any part of the terminals.

The openings 15 are defined by first and second edges 30 and 31, respectively, which comprise the edge or material thickness of opposed sides of the switch body 2 having the opening 15 passing therethrough. Referring to FIG. 3, each of the edges 30 and 31 includes a line segment 32 and 33, respectively. The line segments 32 and 33 define the minimum distance between the edges 30 and 31, the line segments 32 and 33 being substantially parallel to one another. Each of the edges 30 and 31 are formed from a partial conic section so that a surface area 34 of the respective edges falls away from the line segments 32 and 33 sufficiently to permit removal of the part from the mold used for part formation, without damage. While the exact technical reasons for the lack of damage to the part during its extraction from a suitable forming mold or die is unknown, it is theorized that after initial breakaway, the clearance provided by the conic shape of the side walls enables the material from which the switch assembly enclosure is constructed to contract freely, decreasing the hoop stress between the material of the part and the forming die. Regardless of theory of operation, however, switch assemblies constructed in accordance with the principles of this invention enable the formation of openings through the enclosure which contain a pair of parallel line segments, those parallel line segments defining a minimum width of the opening. Consequently, a suitable contact 14 may be frictionally engaged by the line segments 32 and 33, along the entire height of the opening, effectively closing the cavity 8 against possible environmental contamination, once the top 9 is intermounted with the switch body 2.

Numerous variations, within the scope of the appended claims, will be apparent to those skilled in the art in light of the foregoing description and accompanying drawings. Thus, the design silhouette of the enclosure 1 may be varied in other embodiments of this invention. Likewise, while the enclosure was described as a switch body, the invention has application to other enclosure forms in which openings are provided through the enclosure. Preferably, the switch body 2 and top 9 are formed from a plastic material. However, other materials are compatible with the broader aspects of this invention. These variations are merely illustrative.

Having thus described the invention, what is claimed and desired to be secured by Letters Patent is:

1. In a molded enclosure including a wall with a predetermined material thickness, said wall having an opening in it for permitting passage of a second structural member through it, the improvement comprising means for defining the opening such that the opening has zero effective draft, said opening defining means comprising a first edge, and a second edge oppositely opposed to and spaced from said first edge, each of said first and said second edges including a surface area, said surface area being formed from a part of a conic section, each conic section having at least one line segment parallel to a line segment of the opposed edge, said conic section including substantially the entire thickness of said material thickness.

2. The improvement of claim 1 wherein said line segments delimit the minimum separation between said first and said second edges.

3. The improvement of claim 2 wherein said conic sections have the shape of a partial frustum in silhouette.

4. The improvement of claim 2 wherein said enclosure comprises a switch body, including a terminal passing through said opening, said terminal having a length dimension and a width dimension, the line segment of each of said opposed edges abutting said terminal along the entire width dimension of said terminal.

5. The improvement of claim 4 wherein said switch body has a plurality of openings formed in it for passing terminals through said switch body, sets of opposed edges defining said opening plurality abutting the terminals passing therethrough along the parallel line segments of each of said edges.

6. The improvement of claim 5 wherein said switch body comprises a bottom wall, and at least one side wall extending upwardly from said bottom wall, said side wall having an opening in it defined by said first and second oppositely opposed edges.

7. The improvement of claim 6 wherein said switch body has a depth dimension, said depth dimension being substantially equal to the height of the terminal passing through said opening.

8. The improvement of claim 7 further characterized by a top wall, said top wall being substantially planar and having a lip formed along one side of it, said switch body having a lip formed along said side wall which mates with the lip of said top wall in an intermounted position of said top wall of said switch body.

9. A molded enclosure having a zero effective draft opening formed in it, comprising:
   at least one wall, said wall having a material thickness, the material thickness of said wall having said opening formed in it, said opening being defined by a first edge and a second edge oppositely opposed to one another and defining said opening through said wall, each of said edges forming at least a portion of a conic section, each of said conic sections having a line segment at the minimum separation between said edges parallel to a line segment of the opposed edge, said conic sections including substantially the entire material thickness of said wall.

10. In a molded switch body enclosure, said switch body including a bottom wall having a thickness dimension, and at least one side wall extending upwardly from said bottom wall, said side wall having an opening in it, said opening permitting passage of a terminal through said wall, and a terminal mounted along said switch body through said opening, said switch body having a depth dimension substantially equal to the height of the terminal passing through said opening, the improvement comprising means for defining the opening such that the opening has zero effective draft, said opening defining means comprising a first edge, and a second edge oppositely opposed to and spaced from said first edge, each of said first and said second edges including a surface area, said surface area being formed from a part of a conic section, said conic section including substantially said thickness dimension, each conic section having at least one line segment parallel to a line segment of the opposed edge, said line segments delimiting the minimum separation between said first and said second edges, the line segment of each of said opposed edges abutting said terminal along the entire height of said terminal.

11. The improvement of claim 10 further characterized by a top wall, said top wall being substantially planar and having a lip formed along one side of it, said switch body having a lip formed along said side wall which mates with the lip of said top wall in an intermounted position of said top wall and said switch body.

* * * * *